US012787354B2

(12) United States Patent
Nemoto et al.

(10) Patent No.: US 12,787,354 B2
(45) Date of Patent: Nov. 3, 2026

(54) MOS TYPE SEMICONDUCTOR DEVICE HAVING FIELD PLATE ELECTRODE AND METHOD FOR MANUFACTURING THE SAME

(71) Applicant: Kabushiki Kaisha Toshiba, Tokyo (JP)

(72) Inventors: Hiroki Nemoto, Fuchu (JP); Yusuke Kobayashi, Yokohama (JP); Tomoaki Inokuchi, Yokohama (JP); Hiro Gangi, Ota (JP); Tatsuo Shimizu, Shinagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1275 days.

(21) Appl. No.: 17/651,645

(22) Filed: Feb. 18, 2022

(65) Prior Publication Data

US 2023/0078447 A1 Mar. 16, 2023

(30) Foreign Application Priority Data

Sep. 15, 2021 (JP) ................................ 2021-150190

(51) Int. Cl.

*H10D 30/66* (2025.01)
*H10D 30/01* (2025.01)
*H10D 64/00* (2025.01)
*H10D 64/27* (2025.01)

(52) U.S. Cl.

CPC ....... *H10D 30/668* (2025.01); *H10D 30/0297* (2025.01); *H10D 64/112* (2025.01); *H10D 64/117* (2025.01); *H10D 64/513* (2025.01)

(58) Field of Classification Search

CPC ............ H10D 30/668; H10D 30/0297; H10D 64/112; H10D 64/117; H10D 64/513; H10D 64/2527; H10D 64/518; H10D 62/393; H10D 62/107

USPC ........................................................ 257/330

See application file for complete search history.

(56) References Cited

U.S. PATENT DOCUMENTS

| | | | | |
|---|---|---|---|---|
| 9,525,059 | B1 | 12/2016 | Kobayashi | |
| 2008/0087951 | A1* | 4/2008 | Takaya | H10D 30/0297 257/334 |
| 2009/0206924 | A1 | 8/2009 | Zeng et al. | |
| 2011/0254088 | A1* | 10/2011 | Darwish | H10D 30/0297 257/341 |
| 2015/0021656 | A1* | 1/2015 | Kitagawa | H10D 64/117 257/331 |

(Continued)

FOREIGN PATENT DOCUMENTS

| | | |
|---|---|---|
| JP | 8-264772 A | 10/1996 |
| JP | 2011-512677 A | 4/2011 |

(Continued)

*Primary Examiner* — Mohammad M Hoque

(74) *Attorney, Agent, or Firm* — Oblon, McClelland, Maier & Neustadt, L.L.P.

(57) ABSTRACT

A semiconductor device includes a first electrode, a second electrode, a first semiconductor region of a first conductivity type, a second semiconductor region of a second conductivity type, a third semiconductor region of a first conductivity type, a fourth semiconductor region of a second conductivity type, a third electrode connected to the second electrode and the fourth semiconductor region, a first insulating region, a gate electrode, and a second insulating region.

10 Claims, 7 Drawing Sheets

(56) References Cited

U.S. PATENT DOCUMENTS

| | | | | |
|---|---|---|---|---|
| 2017/0207335 | A1 | 7/2017 | Lin et al. | |
| 2018/0204917 | A1 | 7/2018 | Lin et al. | |
| 2021/0036102 | A1* | 2/2021 | Kyogoku | H10D 12/031 |

FOREIGN PATENT DOCUMENTS

| | | | |
|---|---|---|---|
| JP | 2017-55016 | A | 3/2017 |
| JP | 2019-505994 | A | 2/2019 |
| JP | 2020-515050 | A | 5/2020 |

* cited by examiner

MOS TYPE SEMICONDUCTOR DEVICE HAVING FIELD PLATE ELECTRODE AND METHOD FOR MANUFACTURING THE SAME

CROSS-REFERENCE TO RELATED APPLICATIONS

This application is based upon and claims the benefit of priority from Japanese Patent Application No. 2021-150190, filed on Sep. 15, 2021, and the entire contents of which are incorporated herein by reference.

FIELD

Embodiments described herein relate generally to a semiconductor device and a method for manufacturing the semiconductor device.

BACKGROUND

Secondary breakdown (thermal runaway) is one of failure causes of a semiconductor device including a MOS field-effect transistor (MOSFET). The secondary breakdown is a phenomenon in which a threshold voltage or a channel resistance decrease due to an increase in device temperature due to current concentration, a current is concentrated in a channel portion to generate heat, and positive feedback in which the current further increases occurs to cause breakdown. For example, secondary breakdown resistance is improved by increasing a channel length and a gate electrode, but a product Ron·Qg of on-resistance and gate input capacitance, which is one of performance indexes, is deteriorated.

DETAILED DESCRIPTION

Figure 1:
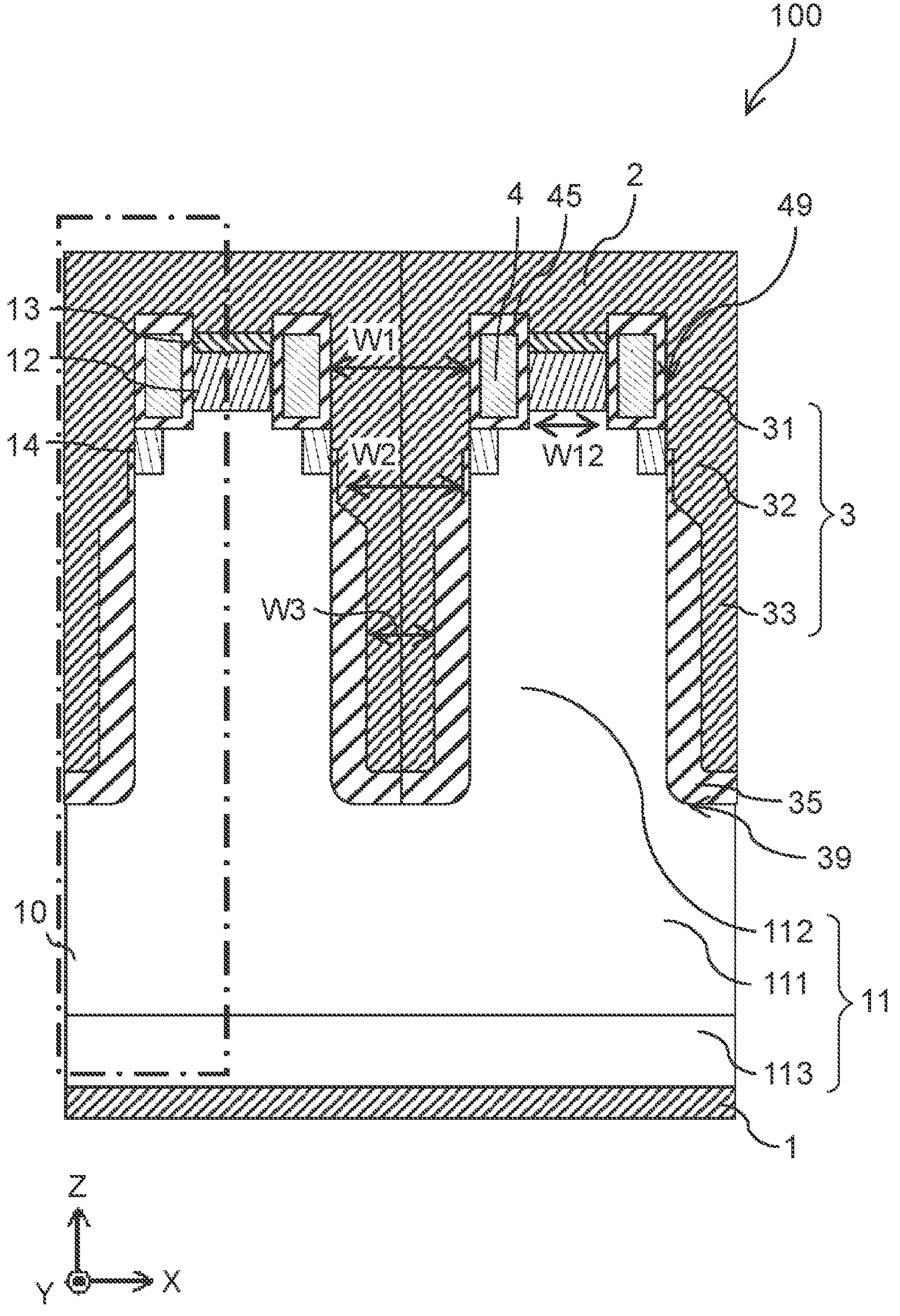
FIG. 1 is a cross-sectional view of a semiconductor device according to an embodiment.

Hereinafter, embodiments will be described with reference to the drawings.

Parts denoted by the same reference numerals indicate the same parts.

Note that the drawings are schematic or conceptual, and the relationship between thicknesses and widths of each portion, a ratio coefficient of a size between the portions, and the like are not necessarily the same as actual ones. In addition, even in the case of representing the same portion, dimensions and ratio coefficients may be represented differently from each other depending on the drawings.

In the present specification, when there are notations of n+ type, n type, and n− type, it means that an n-type impurity concentration decreases in the order of n+ type, n type, and n− type. In addition, when there are notations of a p+ type, a p type, and a p− type, it means that the p-type impurity concentration decreases in the order of p+ type, p type, and p− type.

First Embodiment

A configuration of a semiconductor device 100 according to an embodiment will be described with reference to FIG. 1.

FIG. 1 is a cross-sectional view of a semiconductor device according to an embodiment.

The semiconductor device 100 is, for example, a MOS field-effect transistor (MOSFET).

Hereinafter, a case where a first conductivity type is an n type and a second conductivity type is a p type will be described as an example. The semiconductor device 100 includes a first electrode 1 (drain electrode), a second electrode 2 (source electrode), a third electrode 3 (field plate electrode), a gate electrode 4, a semiconductor layer 10, a first insulating region 35 (field plate insulating film), and a second insulating region 45 (gate insulating film). The semiconductor layer 10 includes a first semiconductor region 11 of a first conductivity type (n), a second semiconductor region 12 of a second conductivity type (p), a third semiconductor layer 13 of a first conductivity type (n+), and a fourth semiconductor region 14 of a second conductivity type (p+).

Here, a direction from the first electrode 1 toward the second electrode 2 is defined as a Z direction (first direction), a direction intersecting the Z direction is defined as an X direction (second direction), and a direction intersecting the X direction and the Z direction is defined as a Y direction (third direction). “Intersecting directions” means that the directions are not parallel, and for example, each of the directions is orthogonal to each other.

The first electrode 1 is, for example, a drain electrode. The second electrode 2 is, for example, a source electrode. The first electrode 1 and the second electrode 2 extend in the X direction and the Y direction. Examples of the materials of the first electrode 1 and the material of the second electrode 2 include metals containing at least one selected from the group of aluminum (Al), titanium (Ti), nickel (Ni), tungsten (W), gold (Au), and the like.

The semiconductor layer 10 is located between the first electrode 1 and the second electrode 2 in the Z direction. The semiconductor layer 10 extends in the X direction and the Y direction. Examples of the main components of the semiconductor layer 10 include silicon (Si), silicon carbide (SiC), gallium nitride (GaN), or the like.

The semiconductor layer 10 includes semiconductor regions of the first conductivity type (n) and the second conductivity type (p). As an n-type conductive impurity element contained in the semiconductor layer 10, for example, phosphorus (P), arsenic (As), or the like is applied. As a p-type conductivity type impurity element contained in the semiconductor layer 10, for example, boron (B) or the like is applied.

The first semiconductor region 11 functions as a drain of the semiconductor device 100. The first semiconductor region 11 is located between the first electrode 1 and the second electrode 2 in the Z direction. The first semiconductor region 11 contains an n-type impurity.

The first semiconductor region 11 includes a first portion 111, a plurality of second portions 112, and a third portion 113 which is a substrate region. The first portion 111 extends in the X direction and the Y direction. The first portion 111 is located between a second portion 112 and a third portion 113. The first portion 111 is electrically connected to the drain electrode 1 via the third portion 113 in the Z direction. The plurality of second portions 112 are separated from each other in the X direction. The second portion 112 extends in the Y direction. The second portion 112 extends from the first portion 111 toward the second electrode 2 in the Z direction. The third portion 113 is located between the first electrode 1 and the first portion 111 in the Z direction. The third portion 113 is electrically connected to the first electrode 1. The third portion 113 is, for example, a silicon substrate extending in the X direction and the Y direction and containing an n-type impurity. The n-type impurity concentration included in the third portion 113 is higher than the n-type impurity concentration included in the first portion 111 and the second portion 112. The first semiconductor region 11 may be configured not to include the third portion 113 by bringing the first portion 111 into contact with the first electrode 1.

The p-type second semiconductor region 12 functions as a channel of the semiconductor device 100. The second semiconductor region 12 contains p-type impurities. The second semiconductor region 12 is on a part of the second portion 112 in the Z direction. In other words, the second semiconductor region 12 is located between the second portion 112 and the second electrode 2 in the Z direction. The second semiconductor region 12 extends in the Y direction. The second semiconductor region 12 is located between two gate electrodes 4 adjacent to each other in the X direction.

The n+ type third semiconductor region 13 functions as a source of the semiconductor device 100. The third semiconductor region 13 is on the second semiconductor region 12 in the Z direction. In other words, the third semiconductor region 13 is located between a part of the second semiconductor region 12 and the second electrode 2 in the Z direction. The third semiconductor region 13 extends in the Y direction. The third semiconductor region 13 is located between two gate electrodes 4 adjacent to each other in the X direction. The third semiconductor region 13 contains n-type impurities. The n-type impurity concentration included in the third semiconductor region 13 is higher than the n-type impurity concentration included in the first portion 111 and the second portion 112 of the first semiconductor region 11. The third semiconductor region 13 is electrically connected to the second electrode 2.

The p++-type fourth semiconductor region 14 is located on another part of the second portion 112 in the Z direction. The fourth semiconductor region 14 is located between the second electrode 2 and the second portion 112 in the Z direction. The fourth semiconductor region 14 is located between the gate electrode 4 and the second portion 112 in the Z direction. A part of the second portion 112 is located between the two fourth semiconductor regions 14 adjacent to each other in the X direction. The fourth semiconductor region 14 is located between the third electrode 3 and a part of the second portion 112 in the X direction. The concentration of the p-type impurity contained in the fourth semiconductor region 14 is higher than the concentration of the p-type impurity contained in the second semiconductor region 12. The fourth semiconductor region 14 is in contact with another part of the second portion 112 at a lower portion of first electrode 1 side in the Z direction. The fourth semiconductor region 14 is in contact with the second insulating region 45 in an upper portion of the second electrode 2 side along the Z direction. The fourth semiconductor region 14 is in contact with a part of the second portion 112 on a surface on a part of the second portion 112 side along the X direction. In the fourth semiconductor region 14, the first electrode 1 side is in contact with the first insulating region 35 along the Z direction on the side surface of the third electrode 3 along the X direction, and the second electrode 2 side is in contact with the third electrode 3 along the Z direction.

The third electrode 3 is a conductive substance that functions as a field plate electrode. The third electrode 3 is located between the first portion 111 and the second electrode 2 in the Z direction. The third electrode 3 is electrically connected to the second electrode 2 and extends from the second electrode 2 toward the first electrode 1 in the Z direction. The third electrode 3 may be integrally made of the same material as the second electrode 2, or may be made of a material different from the second electrode 2. The third electrode 3 extends in the Y direction. The third electrode is located between the second portions 112 adjacent to each other in the X direction. The third electrode 3 includes three portions of a third electrode first portion 31, a third electrode second portion 32, and a third electrode third portion 33.

The third electrode first portion 31 is connected to the second electrode 2. The third electrode first portion 31 is located across a region between the gate electrodes 4 adjacent to each other in the X direction and a region between the fourth semiconductor regions 14 adjacent to each other in the X direction. The third electrode first portion 31 is in contact with the second insulating region 45 and is in electrical contact with the fourth semiconductor region 14 in the X direction. The third electrode first portion 31 has a length of a first width W1 in the X direction. The third electrode second portion 32 is located between the third electrode first portion 31 and the first portion 111 in the Z direction. The third electrode second portion 32 is located across a region between the second portions 112 adjacent to each other in the X direction and a region between the fourth semiconductor regions 14 adjacent to each other in the X direction. The third electrode second portion 32 faces the second portion 112 and the fourth semiconductor region 14 via the first insulating region 35 in the X direction. The third electrode second portion 32 has a length of a second width W2 shorter than the first width W1 in the X direction (W1>W2).

The third electrode third portion 33 is located between the third electrode second portion 32 and the first portion 111 in the Z direction. The third electrode third portion 33 is located between the second portions 112 adjacent to each other in the X direction. The third electrode third portion 33 faces the second portion 112 via the first insulating region 35 in the X direction. The third electrode third portion 33 faces the first portion 111 via the first insulating region 35 in the X direction. The third electrode third portion 33 has a length of a third width W3 shorter than the second width W2 in the X direction (W2>W3).

The first insulating region 35 is an insulating substance that functions as a field plate insulating film. The first insulating region 35 is located between the third electrode 3 and the first semiconductor region 11 and between the third electrode 3 and the fourth semiconductor region 14. The first insulating region 35 has an insulating property and electrically separates the third electrode 3 from the second portion 112. The first insulating region 35 is adjacent to a portion of the fourth semiconductor region 14 located on the Z-direction first electrode 1 side and the second portion 112 in the X direction. The first insulating region 35 extends in the Y direction. The first insulating region 35 can include, for example, silicon oxide as a material. Further, the fourth semiconductor region 14 is in direct contact with the third electrode second portion 32 at a portion located on the second electrode 2 side in the Z direction.

The gate electrode 4 is located between a part of the second portion 112 and the second electrode 2 and between the fourth semiconductor region 14 and the second electrode 2 in the Z direction. The gate electrode 4 is located between the second semiconductor region 12 and the third electrode first portion 31 and between the third semiconductor region 13 and the third electrode first portion 31 in the X direction. The second semiconductor region 12 and the third semiconductor region 13 are located between the two gate electrodes 4 adjacent to each other in the X direction. The gate electrode 4 faces the second semiconductor region 12 and the third semiconductor region 13 via the second insulating region 45 in the X direction. The gate electrode 4 is formed inside a trench 49, and the third electrode 3 is formed inside a trench 39. The trench 49 and the trench 39 are different trenches. The gate electrode 4 and the third electrode 3 are separated from each other in the X direction.

The second insulating region 45 is an insulator that functions as a gate insulating film. The second insulating region 45 is located between the gate electrode 4 and the first semiconductor region 11, the second semiconductor region 12, the third semiconductor region 13, the second electrode 2, and the third electrode 3. The second insulating region 45 has an insulating property and electrically separates the gate electrode 4 from the first semiconductor region 11, the second semiconductor region 12, the third semiconductor region 13, the second electrode 2, and the third electrode 3. The second insulating region 45 can include, for example, silicon oxide as a material.

As described above, the semiconductor device 100 has a vertical MOSFET structure including the field plate electrode (third electrode 3) and the trench gate electrode (gate electrode 4). In the semiconductor device 100, the fourth semiconductor region 14 and the third electrode 3 are electrically connected on the drain electrode (first electrode 1) side with respect to the gate electrode 4 in the Z direction.

A method for manufacturing the semiconductor device 100 will be described with an example in which the semiconductor device 100 is a vertical MOSFET having a withstand voltage of 100 V. FIGS. 2A to 2M are cross-sectional views illustrating a manufacturing process of the semiconductor device of the embodiment. FIGS. 2A to 2M are obtained by extracting a one-dot chain line portion of FIG. 1.

Figure 2A:
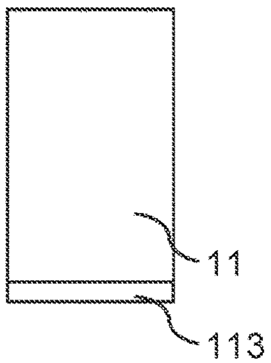
FIGS. 2A to 2M are views illustrating manufacturing processes 1 to 13 of the semiconductor device according to the embodiment.

(Process 1) An n+ semiconductor substrate (third portion 113) is prepared. On the n+ semiconductor substrate, epitaxial growth of the first semiconductor region 11 (to be the first portion 111 and the second portion 112) having an n-type impurity concentration of 1.0e16 to 1.0e18 $cm^{-3}$ and a thickness of 8 to 10 μm in the Z direction is performed. (FIG. 2A)

Figure 2B:
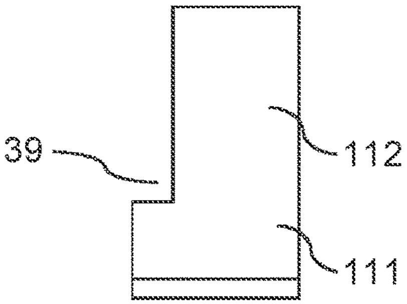

(Process 2) The oxide film of 0.1 to 2 nm is deposited on a semiconductor region formed by epitaxial growth, and the trench 39 having a depth of 2 to 10 μm is opened by photolithography and is formed by dry etching. (FIG. 2B)

Figure 2C:
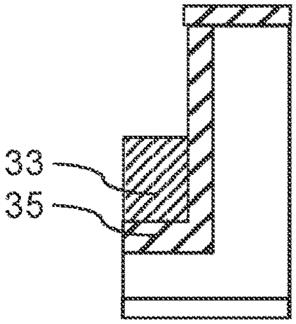

(Process 3) The oxide film (first insulating region 35) of 20 to 200 nm is formed on the surface of the semiconductor region by thermal oxidation, and polysilicon (third electrode third portion 33) is deposited. (FIG. 2C)

Figure 2D:
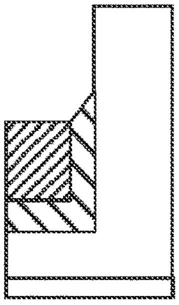

(Process 4) The polysilicon and the oxide film attached to the sidewall of the trench 39 and the outside of the trench 39 are removed by isotropic etching. (FIG. 2D)

Figure 2E:
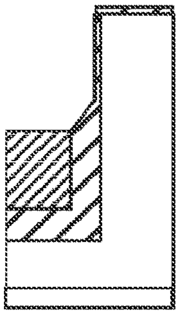

(Process 5) The oxide film of about 50 nm is formed in the semiconductor region by heat treatment. (FIG. 2E)

Figure 2F:
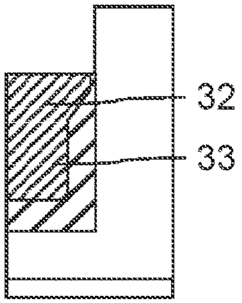

(Process 6) After the polysilicon (third electrode second portion 32) is deposited inside the trench 39, a part of the oxide film of about 50 nm formed in process 5 is removed by isotropic etching. In this case, a part of the semiconductor region is exposed from the oxide film (first insulating region 35) in the upper portion of the sidewall of the trench 39. (FIG. 2F)

Figure 2G:
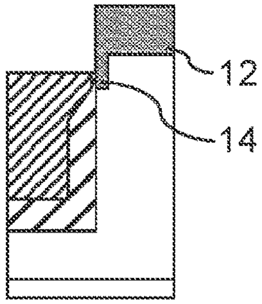

(Process 7) The lithography and ion implantation of p-type impurities are performed on the semiconductor region to simultaneously form p-type semiconductor regions (the second semiconductor region 12 and the fourth semiconductor region 14) at a concentration of 1.0e17 to 1.0e20 $cm^{-3}$. The second semiconductor region 12 and the fourth semiconductor region 14, respectively, may be formed at different timings or concentrations. (FIG. 2G)

Figure 2H:
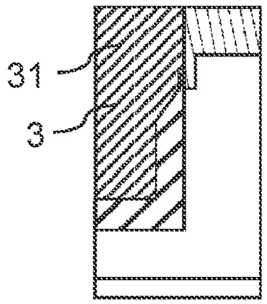

(Process 8) The polysilicon is deposited up to the upper portion of the trench 39 to form the third electrode 3. (FIG. 2H)

Figure 2L:
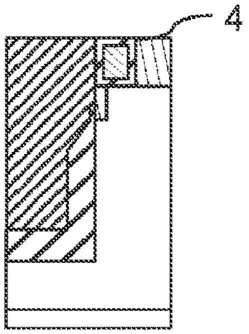
Figure 2I:
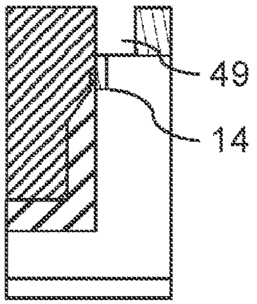

(Process 9) A part of the p-type semiconductor region formed in process 8 is removed by dry etching to form the trench 49 having a depth of 0.1 to 4 μm. (FIG. 2I)

Figure 2M:
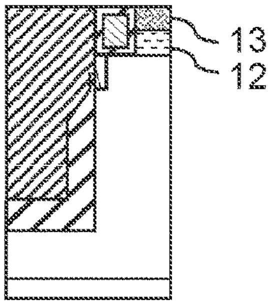
Figure 2J:
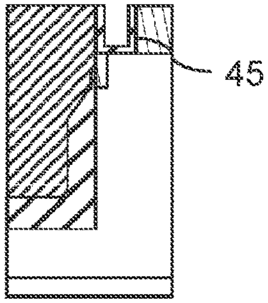

(Process 10) The oxide film is formed by thermal oxidation, and the oxide film is removed while leaving the inside of the trench, thereby forming the second insulating region 45 having a thickness of 10 to 100 nm inside the trench 49. (FIG. 2J)

Figure 2K:
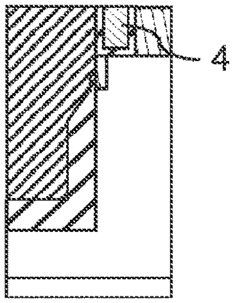

(Process 11) The gate electrode 4 is formed by depositing doped polysilicon in the trench 49. (FIG. 2K)

(Process 12) The second insulating region 45 is formed on the upper portion of the gate electrode 4 by thermal oxidation or the like. (FIG. 2L)

(Process 13) The third semiconductor region 13 is formed at a concentration 1.0e17 to 1.0e21 $cm^{-3}$ by ion-implanting n-type impurities. (FIG. 2M)

(Process 14) The first electrode 1 and the second electrode 2 are formed. A gate contact (not illustrated) penetrating the second insulating region 45 and a gate pad (not illustrated) electrically connected to the gate electrode 4 via the gate contact are formed.

The semiconductor device 100 illustrated in FIG. 1 can be provided by the above-described manufacturing method.

The operation of the semiconductor device 100 will be described.

The operation of the semiconductor device 100 will be described. The semiconductor device 1 operates when a potential is applied to the first electrode 1, the second electrode 2, and the gate electrode 4 from a power supply device and a drive device (not illustrated in FIG. 1). Hereinafter, the potential applied to the second electrode 2 is set as a reference (0 V). A potential of 0 V is applied to the second electrode 2, and a positive potential is applied to the first electrode 1.

When the semiconductor device 100 is turned on, a potential higher than the threshold potential Vth is applied to the gate electrode 4. As a result, a channel is formed in the second semiconductor region 12, and a current flows from the first electrode 1 to the second electrode 2 through the first semiconductor region 11, the second semiconductor region 12, and the third semiconductor region 13.

When the semiconductor device 100 is turned off, a potential lower than the threshold potential Vth is applied to the gate electrode 4. No channel is formed in the second semiconductor region 12, and no current flows between the second electrode 2 and the first electrode 1.

A mechanism of secondary breakdown of the MOSFET will be described.

(1-1) First, when current is conducted to the MOSFET, the MOSFET generates heat due to on-resistance and switching loss.

(1-2) Next, when the temperature of the MOSFET rises due to heat generation, the threshold voltage of the MOSFET decreases. When the gate voltage is constant, the channel resistance of the MOSFET in which the threshold voltage has lowered decreases.

(1-3) A large current flows through the MOSFET in which the channel resistance is reduced. The MOSFET through which a large current flows further generates heat and returns to (1-1).

In the MOSFET, a positive feedback mechanism that repeats (1-1) to (1-3) operates to increase the current amount (cause secondary breakdown), and the MOSFET is destroyed when it exceeds the allowable amount of the semiconductor layer/insulating layer.

Here, it will be described that the semiconductor device 100 of the present embodiment incorporates a junction field effect transistor (JFET) structure.

The semiconductor device 100 incorporates a junction field effect transistor (JFET) having the fourth semiconductor region 14 as a gate, a part of the second portion 112 as a source, and the first semiconductor region 11 as a drain. In this JFET, under the condition that the gate potential of the JFET applied to the fourth semiconductor region 14 is constant (0 V), as the operating temperature increases, the resistance value increases and the amount of current conducted between the drain and the source of the JFET decreases. In addition, as the operating temperature decreases, the resistance value of the JFET decreases and the amount of current conducted between the drain and the source of the JFET increases. The drain current of the MOSFET flowing between the first electrode 1 and the second electrode 2 is controlled by JFET operation.

Furthermore, it will be described that the semiconductor device 100 has a small change in current characteristics due to a temperature change and can suppress occurrence of secondary breakdown.

(2-1) First, when a current is conducted between the first electrode 1 and the second electrode 2 of the semiconductor device 100, heat is generated due to on-resistance and switching loss of the semiconductor device 100.

(2-2) Next, when the temperature of the semiconductor device 100 rises due to heat generation, the threshold voltage of the MOSFET decreases, and the channel resistance of the MOSFET decreases. On the other hand, the resistance of the JFET increases due to an increase in temperature. The channel resistance of the MOSFET and the resistance of the JFET are connected in series between the first electrode 1 and the second electrode 2. Therefore, the decrease in the channel resistance of the MOSFET can be canceled by the increase in the resistance of the JFET.

(2-3) In the semiconductor device 100, even if the operating temperature rises, the resistance between the first electrode 1 and the second electrode is less likely to decrease, and the amount of current to be conducted is less likely to increase.

In the semiconductor device 100, the drain current of the MOSFET is less likely to increase after (2-3). Since the semiconductor device 100 can suppress a further temperature rise caused by an increase in current, the occurrence of secondary breakdown can be suppressed. Also, since the semiconductor device 100 has the channel resistance of the MOSFET and the resistance of the JFET having opposite temperature characteristics, a change in current characteristics due to a temperature change decreases. Note that, by adjusting the temperature characteristics of the channel resistance of the MOSFET and the resistance of the JFET, the semiconductor device 100 can also be configured so that the drain current amount decreases as the temperature of the semiconductor device 100 rises.

In addition, it will be described that the semiconductor device 100 can realize a high withstand voltage by dispersion of the electric field.

When the semiconductor device 100 is turned off, an electric field caused by the voltage between the first electrode 1 and the second electrode 2 is generated in the semiconductor region located between the adjacent third electrodes 3, particularly, in the second portion 112. The concentration of the electric field is one of the causes of the destruction of the semiconductor layer 10. The third electrode extending from the second electrode 2 toward the first electrode 1 disperses an electric field applied to the semiconductor layer 10 and forms a depletion layer in the second portion 122, thereby improving the withstand voltage of the semiconductor device 100.

As described above, the semiconductor device 100 according to the embodiment can improve the secondary breakdown resistance without designing the channel length to be long and the gate electrode 4 to be large. Therefore, the semiconductor device 100 can realize a high secondary breakdown resistance while maintaining a low Ron·Qg.

A modification of the embodiment will be described.

First Modification

Figure 3:
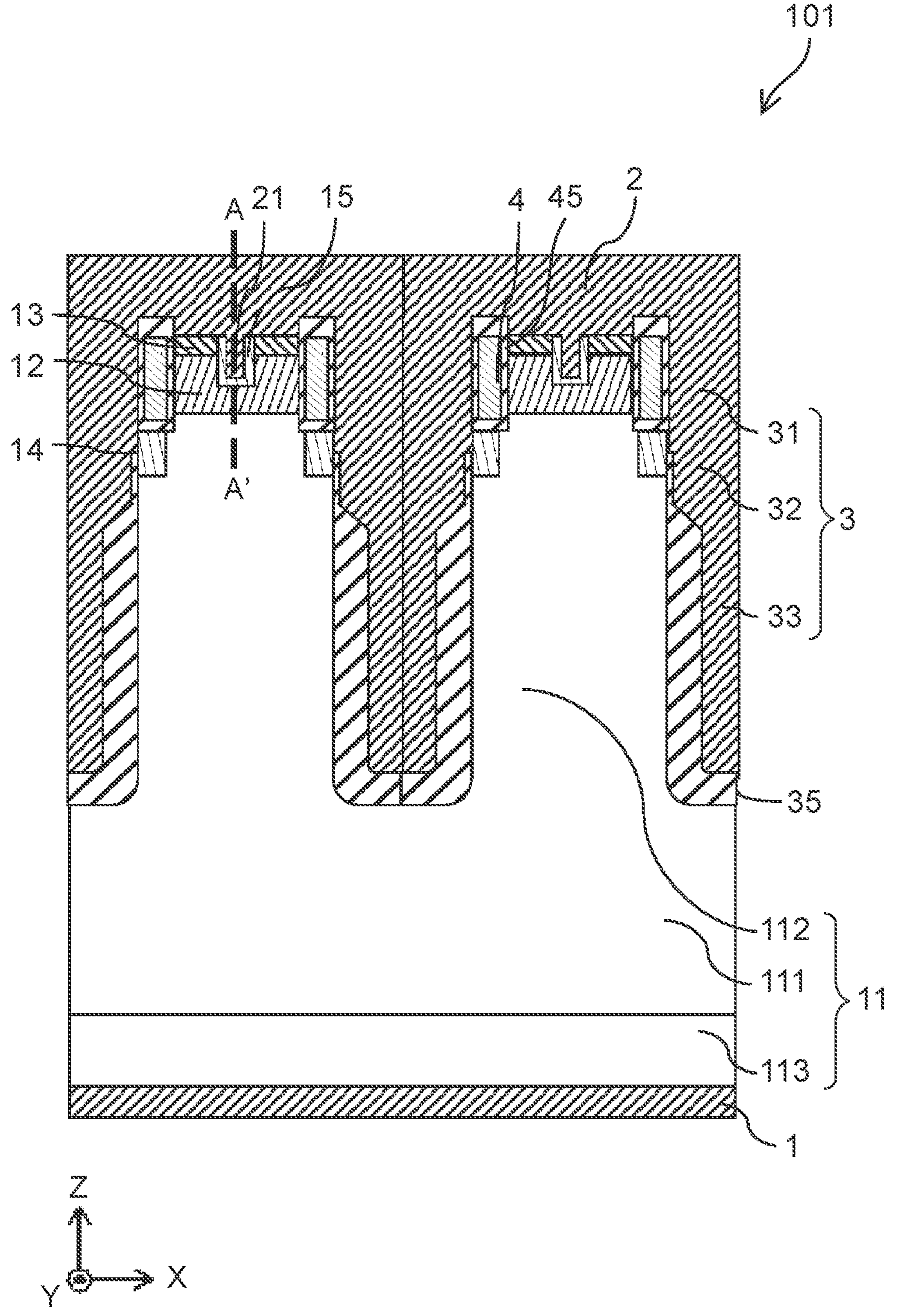
FIG. 3 is a cross-sectional view of a semiconductor device according to a first modification.

FIG. 3 is a cross-sectional view of a semiconductor device according to a first modification. The same reference numerals as those in FIG. 1 denote the same parts in the reference numerals in FIG. 3. A semiconductor device 101 of a first modification is different from the semiconductor device 100 of the embodiment in having a trench contact structure. In the first modification, the semiconductor device 101 includes a contact portion 21 in the second electrode 2. In the first modification, the semiconductor device 101 includes a p+-type fifth semiconductor region 15.

The contact portion 21 extends from the second electrode 2 toward the first electrode in a Z direction. The contact portion 21 extends in a Y direction. The contact portion 21 penetrates a third semiconductor region 13 and extends to an inside of a second semiconductor region 12 in the Z direction.

A p+-type fifth semiconductor region 15 is located between the contact portion 21 and the third semiconductor region 13 and between the contact portion 21 and the second semiconductor region 12 in an X direction. The p+-type fifth semiconductor region 15 is in contact with the contact portion 21, the third semiconductor region 13, and the second semiconductor region 12. A part of the p+-type fifth semiconductor region 15 is located between the contact portion 21 and the second semiconductor region 12 in the Z direction.

Figure 4:
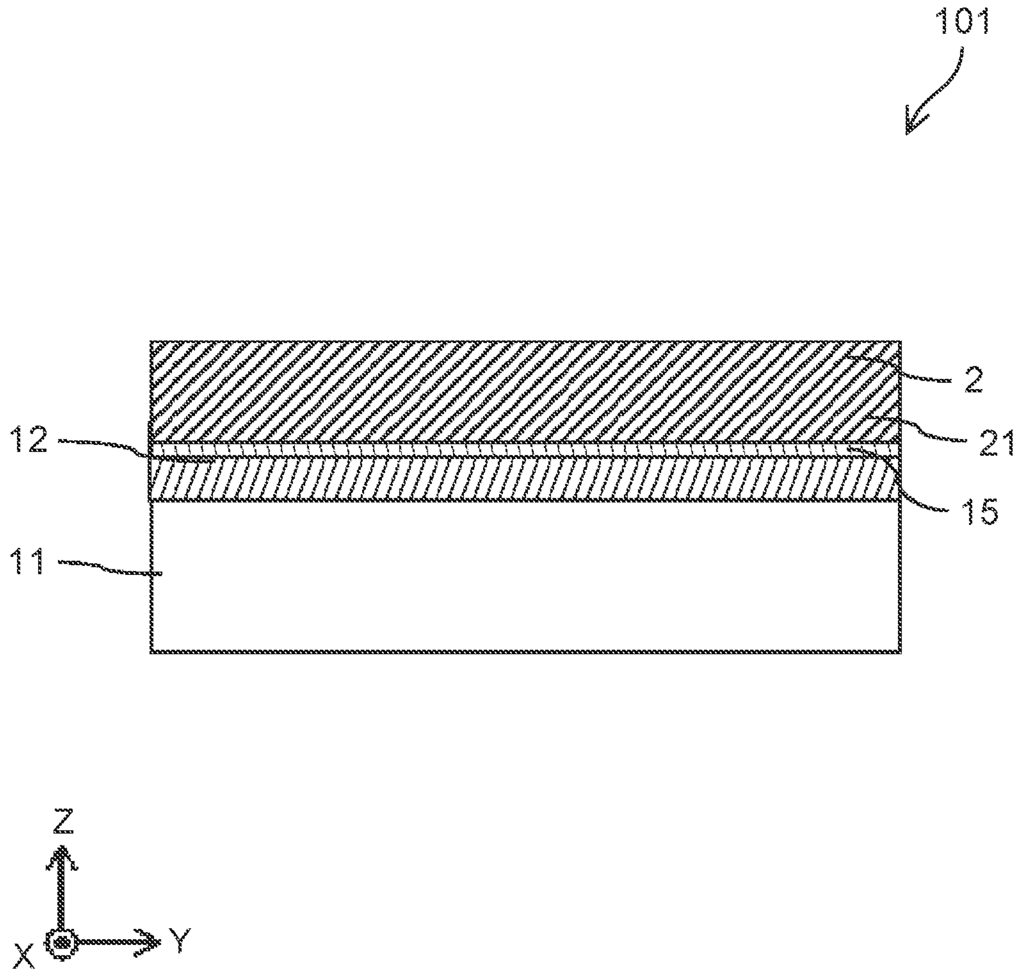
FIG. 4 is a view corresponding to a cross section taken along line A-A' of FIG. 4.

FIG. 4 is a cross-sectional view of a semiconductor device according to a first modification; FIG. 4 is a view corresponding to a cross section taken along line A-A' of FIG. 3. The contact portion 21 extends in a Y direction.

Figure 5:
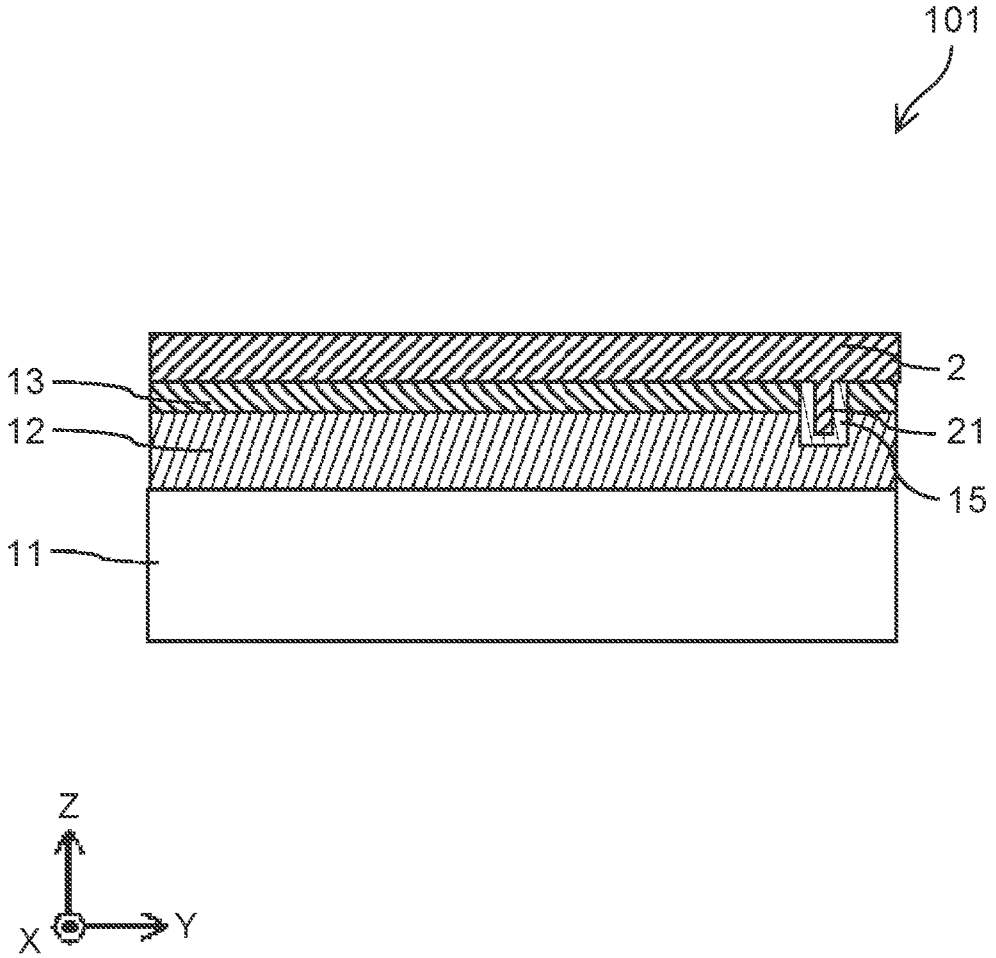
FIG. 5 is a cross-sectional view of another semiconductor device according to the first modification.

Note that the contact portion 21 may not necessarily extend in the Y direction. FIG. 5 is a cross-sectional view of another semiconductor device according to a first modification. FIG. 5 is a view corresponding to a cross section taken along line A-A' of FIG. 3. For example, as illustrated in FIG. 5, the fifth semiconductor region 15 may be located between the third semiconductor region 12 and the contact portion 21 in the Y direction.

According to the semiconductor device 101 of the first modification, the potential of the second semiconductor region 12 and the third semiconductor region 13 electrically connected to the second electrode 2 via the contact portion 21 are stabilized, and the threshold reliability is improved.

Second Modification

In the second modification, the width of the second semiconductor region 12, that is, the channel width is narrower than that of the semiconductor device of the first embodiment. For example, a width of a second semiconductor region 12 in an X direction, which is indicated by W12 in FIG. 1, is 10 nm or more and 200 nm or less.

In the semiconductor device 100 of the first embodiment and the semiconductor device of the second modification, a trench 49 in which a gate electrode 4 is provided and the trench 39 in which a third electrode 3 is provided are independently formed at different depths.

In general, when the trench is formed in a semiconductor layer 10 by etching, the semiconductor layer (second portion 112) adjacent to the trench is cut. For this reason, the deeper the trench, the longer the interval between the trenches that can be manufactured. In the embodiment and the second modification, the channel width, that is, the width W12 of the second semiconductor region 12 in the X direction is defined by the trench interval of the shallow trench 49 (the groove provided with the gate electrode 4). That is, the semiconductor device 100 of the embodiment can be manufactured so that the width W12 of the channel is narrow as in the second modification without being limited to the design of the deeper trench 39.

Generally, when the channel length is narrow, the influence of the electric field from the Z-axis direction is increased, the gate control electric field region in the X-axis direction narrows, and the actual channel length becomes shorter than expected. In this case, a short channel effect occurs in which actual Vth becomes smaller than design Vth and variation of Vth becomes large. On the other hand, when the channel width is narrow, the controllability of the gate electric field is enhanced, and thus, the short channel effect is suppressed, and when the channel width is narrow to the nm order, a quantum effect in which a potential of an SiO2/Si interface increases is exhibited, and the influence of the electric field in the Z-axis direction can be weakened.

In the second modification, since the channel width is narrow, the short channel effect is suppressed. Therefore, in the second modification, the channel length can be shortened, and the gate capacitance can be reduced.

Third Modification

Figure 6:
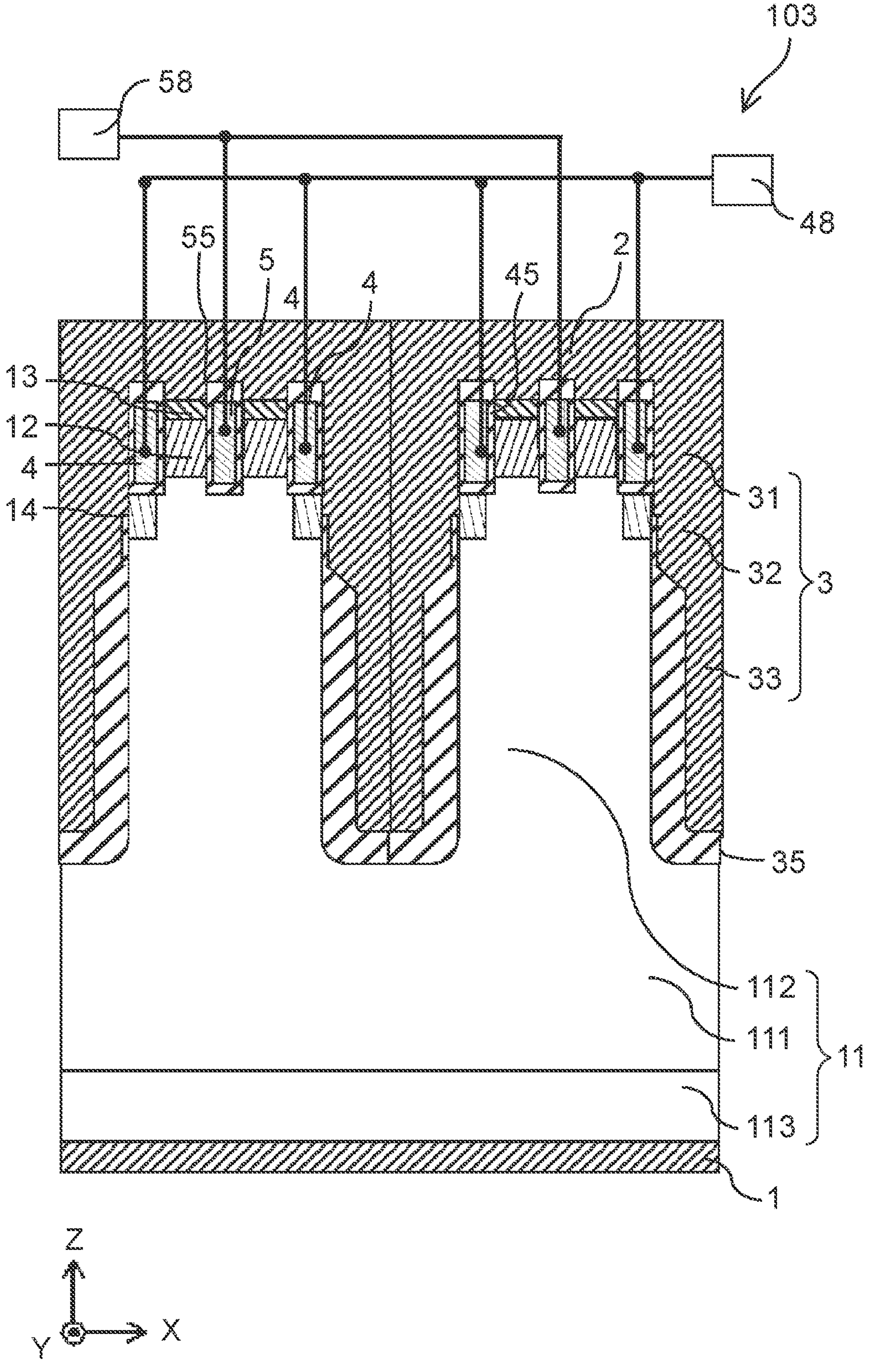
FIG. 6 is a cross-sectional view of a semiconductor device according to a third modification.

FIG. 6 is a cross-sectional view of a semiconductor device according to a third modification. A semiconductor device 103 of a third modification is different from the semiconductor device 100 in that the semiconductor device includes a second gate electrode 5 and a third insulating region 55. In a cross-sectional view (FIG. 6) according to the third modification, at least two second semiconductor regions 12 and at least two third semiconductor regions 13 are provided between one second portion 112 of the first semiconductor region 11 and a second electrode 2 in a Z direction.

A second gate electrode 5 is located between the second portion 112 and the second electrode 2 in the Z direction. The second gate electrode 5 and a gate electrode 4 are electrically separated from each other, and are connected to a drive device or a power supply device (not illustrated) via an electrode pad 58 and an electrode pad 48 connected to each other. The second gate electrode 5 and the gate electrode 4 are subjected to potential control independently of each other via the electrode pad 58 and the electrode pad 48, respectively. The second gate electrode 5 and the gate electrode 4 are separated from each other in an X direction. The second gate electrode 5 is located across a region between the second semiconductor regions 12 adjacent to each other in the X direction and a region between the third semiconductor regions 13 adjacent to each other in the X direction. The second semiconductor region 12 and the third semiconductor region 13 are located between the gate electrode 4 and the second gate electrode 5 in the X direction.

The third insulating region 55 is an insulator that functions as an insulating film of the second gate electrode 5. The third insulating region 55 is located between the second gate electrode 5 and the first semiconductor region 11, the second semiconductor region 12, the third semiconductor region 13, and the second electrode 2, and electrically separates the second gate electrode 5 from the first semiconductor region 11, the second semiconductor region 12, the third semiconductor region 13, and the second electrode 2.

In the third modification, a value of a threshold voltage of MOSFET can be controlled according to the voltage applied to the second gate electrode 5. For example, by applying a negative fixed potential to the second gate electrode, the semiconductor device 103 according to the third modification can realize a desired ON voltage, and an electric field between the gates increases to provide a function of suppressing the short channel effect.

The above-described embodiment and the modifications thereof can be realized by appropriately combining. According to the above-described embodiment and the modifications thereof, it is possible to provide a semiconductor device capable of suppressing the occurrence of secondary breakdown by the built-in JFET structure.

Although some embodiments of the present invention have been described, these embodiments are presented as examples and are not intended to limit the scope of the invention These novel embodiments can be implemented in various other forms, and various omissions, replacements, and changes can be made without departing from the spirit of the invention. The embodiments or modifications thereof are included in the scope of the invention described in the claims and the scope thereof as well as in the scope or gist of the description.

What is claimed is:

1. A semiconductor device, comprising:

a first electrode;

a second electrode;

a first semiconductor region of a first conductivity type that is located between the first electrode and the second electrode in a first direction from the first electrode toward the second electrode and has a first portion and a plurality of second portions, the first portion being electrically connected to the first electrode and extending in a second direction intersecting the first direction, the second portion extending from the first portion toward the second electrode in the first direction;

a second semiconductor region of a second conductivity type that is located between the second portion and the second electrode in the first direction;

a third semiconductor region of the first conductivity type that is located between the second semiconductor region and the second electrode in the first direction and electrically connected to the second electrode;

a fourth semiconductor region of the second conductivity type that is located between the second portion and the second electrode in the first direction;

a third electrode that is located between the first portion and the second electrode in the first direction, is at least partially located parallel to the second portion in the second direction, and electrically connected to the second electrode and the fourth semiconductor region;

a first insulating region that is located between the third electrode and both the first portion and the second portion;

a gate electrode that is located between the fourth semiconductor region and the second electrode in the first direction and located between the third electrode and both the second semiconductor region and the third semiconductor region in the second direction; and a second insulating region that electrically separates the gate electrode from the first semiconductor region, the second semiconductor region, the third semiconductor region, the fourth semiconductor region, and the second electrode, wherein the fourth semiconductor region and the third electrode are in direct contact with each other in the second direction.

2. The semiconductor device according to claim 1, wherein the gate electrode is provided in plural, and the second semiconductor region and the third semiconductor region are located between two of the gate electrodes adjacent to each other in the second direction.

3. The semiconductor device according to claim 1, wherein the fourth semiconductor region and the first insulating region are adjacent to each other in the second direction.

4. The semiconductor device according to claim 1, wherein a concentration of a second conductivity type impurity contained in the fourth semiconductor region is higher than a concentration of a second conductivity type impurity contained in the second semiconductor region.

5. The semiconductor device according to claim 1, wherein the second electrode includes a contact portion extending toward the first electrode in the first direction, and the semiconductor device includes a fifth semiconductor region located between the second semiconductor region and the second electrode in the first direction and between the contact portion and both the second semiconductor region and the third semiconductor region, and the fifth semiconductor region has a second conductivity type impurity concentration higher than a second conductivity type impurity concentration included in the second semiconductor region.

6. The semiconductor device according to claim 5, wherein the fifth semiconductor region is located between the third semiconductor region and the contact portion in the second direction.

7. The semiconductor device according to claim 5, wherein the fifth semiconductor region is located between the third semiconductor region and the contact portion in a third direction intersecting the first direction and the second direction.

8. The semiconductor device according to claim 1, wherein a width of the second semiconductor region in the second direction is 10 nm or more and 200 nm or less.

9. The semiconductor device according to claim 1, further comprising:

a second gate electrode that is located between the second portion and the second electrode in the first direction, and a third insulating region that electrically separates the second gate electrode from the first semiconductor region, the second semiconductor region, the third semiconductor region, and the second electrode, wherein the second gate electrode and the gate electrode are separated in the second direction and electrically separated from each other, and the second semiconductor region and the third semiconductor region are located between the second gate electrode and the gate electrode in the second direction.

10. A semiconductor device, comprising:

a first electrode;

a second electrode;

a first semiconductor region of a first conductivity type that is located between the first electrode and the second electrode in a first direction from the first electrode toward the second electrode and has a first portion and a plurality of second portions, the first portion being electrically connected to the first electrode and extending in a second direction intersecting the first direction, the second portion extending from the first portion toward the second electrode in the first direction;

a second semiconductor region of a second conductivity type that is located between the second portion and the second electrode in the first direction;

a third semiconductor region of the first conductivity type that is located between the second semiconductor region and the second electrode in the first direction and electrically connected to the second electrode;

a fourth semiconductor region of the second conductivity type that is located between the second portion and the second electrode in the first direction;

a third electrode that is located between the first portion and the second electrode in the first direction, is at least partially located parallel to the second portion in the second direction, and electrically connected to the second electrode and the fourth semiconductor region;

a first insulating region that is located between the third electrode and both the first portion and the second portion;

a gate electrode that is located between the fourth semiconductor region and the second electrode in the first direction and located between the third electrode and both the second semiconductor region and the third semiconductor region in the second direction; and a second insulating region that electrically separates the gate electrode from the first semiconductor region, the second semiconductor region, the third semiconductor region, the fourth semiconductor region, and the second electrode, wherein the first insulating region is located between the fourth semiconductor region and the third electrode in the second direction on a first portion of the fourth semiconductor region closer to the first electrode in the first direction, and the fourth semiconductor region is in direct contact with the third electrode in the second direction on a second portion of the fourth semiconductor region closer to the second electrode in the first direction.

* * * * *